US011742258B2

(12) United States Patent
Sato et al.

(10) Patent No.: US 11,742,258 B2
(45) Date of Patent: Aug. 29, 2023

(54) THERMALLY CONDUCTIVE SHEET AND METHOD FOR MANUFACTURING THERMALLY CONDUCTIVE SHEET

(71) Applicant: DEXERIALS CORPORATION, Shimotsuke (JP)

(72) Inventors: Yuma Sato, Shimotsuke (JP); Keisuke Aramaki, Shimotsuke (JP); Yusuke Kubo, Shimotsuke (JP)

(73) Assignee: DEXERIALS CORPORATION, Shimotsuke (JP)

( * ) Notice: Subject to any disclaimer, the term of this patent is extended or adjusted under 35 U.S.C. 154(b) by 0 days.

(21) Appl. No.: 17/617,238

(22) PCT Filed: Apr. 23, 2021

(86) PCT No.: PCT/JP2021/016492
§ 371 (c)(1),
(2) Date: Dec. 7, 2021

(87) PCT Pub. No.: WO2021/230047
PCT Pub. Date: Nov. 18, 2021

(65) Prior Publication Data

US 2022/0262702 A1 Aug. 18, 2022

(30) Foreign Application Priority Data

May 15, 2020 (JP) ................................ 2020-086074
Sep. 4, 2020 (JP) ................................ 2020-149489

(51) Int. Cl.

| | |
|---|---|
| ***C08J 5/18*** | (2006.01) |
| ***H01L 23/373*** | (2006.01) |
| ***B29C 48/00*** | (2019.01) |
| ***C08J 5/04*** | (2006.01) |
| ***C08K 3/22*** | (2006.01) |
| ***C08K 3/28*** | (2006.01) |
| ***C08K 3/38*** | (2006.01) |
| ***C08K 7/18*** | (2006.01) |
| *B29K 101/10* | (2006.01) |
| *B29K 101/12* | (2006.01) |
| *B29K 509/04* | (2006.01) |
| *B82Y 30/00* | (2011.01) |

(52) U.S. Cl.

CPC ...... *H01L 23/3737* (2013.01); *B29C 48/0021* (2019.02); *B29C 48/022* (2019.02); *C08J 5/042* (2013.01); *C08J 5/18* (2013.01); *C08K 3/22* (2013.01); *C08K 3/28* (2013.01); *C08K 3/38* (2013.01); *C08K 7/18* (2013.01); *B29K 2101/10* (2013.01); *B29K 2101/12* (2013.01); *B29K 2509/04* (2013.01); *B29K 2995/0013* (2013.01); *B29K 2995/0094* (2013.01); *B82Y 30/00* (2013.01); *C08K 2003/2227* (2013.01); *C08K 2003/282* (2013.01); *C08K 2003/385* (2013.01); *C08K 2201/001* (2013.01); *C08K 2201/005* (2013.01)

(58) Field of Classification Search

CPC ............. H01L 23/3737; B29C 48/0021; B29C 48/022; C08J 5/042; C08J 5/18; C08K 3/22; C08K 3/28; C08K 3/38; C08K 7/18; C08K 2003/2227; C08K 2003/282; C08K 2003/385; C08K 2201/001; C08K 2201/005; B29K 2101/10; B29K 2101/12; B29K 2509/04; B29K 2995/0013; B29K 2995/0094; B82Y 30/00

USPC .......................................................... 361/704

See application file for complete search history.

(56) References Cited

U.S. PATENT DOCUMENTS

| | | | | |
|---|---|---|---|---|
| 9,922,901 | B2 * | 3/2018 | Aramaki | B81B 3/0081 |
| 2004/0034151 | A1 | 2/2004 | Kaschak et al. | |
| 2008/0241488 | A1 * | 10/2008 | Ohta | H01L 23/3737 156/60 |
| 2013/0136895 | A1 | 5/2013 | Usui et al. | |

(Continued)

FOREIGN PATENT DOCUMENTS

| | | |
|---|---|---|
| CN | 102971365 A | 3/2013 |
| CN | 106084791 A | 11/2016 |

(Continued)

OTHER PUBLICATIONS

Jul. 27, 2021 Written Opinion of the International Searching Authority issued in International Patent Application No. PCT/JP2021/016492.

(Continued)

*Primary Examiner* — Hannah J Pak
(74) *Attorney, Agent, or Firm* — Oliff PLC

(57) ABSTRACT

A thermally conductive sheet having a binder resin, a first thermally conductive filler, and a second thermally conductive filler, wherein the first thermally conductive filler and the second thermally conductive filler are dispersed in the binder resin, and the specific permittivity and the thermal conductivity are different in the thickness direction B and the surface direction A of the thermally conductive sheet. A thermally conductive sheet includes step A of preparing a resin composition for forming a thermally conductive sheet by dispersing a first thermally conductive filler and a second thermally conductive filler in a binder resin, step B of forming a molded block from the resin composition for forming a thermally conductive sheet, and step C of slicing the molded block into a sheet and obtaining a thermally conductive sheet having different relative permittivity and thermal conductivity in the thickness direction and the surface direction.

9 Claims, 3 Drawing Sheets

(56) References Cited

U.S. PATENT DOCUMENTS

2014/0349067 A1 11/2014 Usui et al.
2015/0183951 A1* 7/2015 Bhagwagar ............ C08L 83/14 524/430
2016/0002520 A1* 1/2016 Mochizuki .......... H01L 23/3737 252/75
2017/0309542 A1 10/2017 Aramaki et al.
2022/0018617 A1 1/2022 Kudoh
2022/0289932 A1 9/2022 Kudoh et al.

FOREIGN PATENT DOCUMENTS

JP H06-38460 B2 5/1994
JP 2012-23335 A 2/2012
JP 2012-201106 A 10/2012
JP 2017-024246 A 2/2017
JP 2017-38086 A 2/2017
JP 2017-092345 A 5/2017
JP 2018-073912 A 5/2018
JP 2020-074430 A 5/2020
JP 2020-173945 A 10/2020
JP 2021-061382 A 4/2021
WO 2019/194221 A1 10/2019
WO 2020/105601 A1 5/2020
WO 2021/065522 A1 4/2021

OTHER PUBLICATIONS

Jul. 27, 2021 Search Report issued in International Patent Application No. PCT/JP2021/016492.
Aug. 2, 2022 Supplementary European Search Report issued in European Patent Application 21802937.
Aug. 16, 2022 Office Action issued in European Patent Application 21802937.
JIS K 6911, (1995).
Oct. 31, 2022 Office Action issued in Chinese Application 202180004799.X.
May 17, 2023 Office Action issued in Chinese Application No. 202180004799X.

* cited by examiner

THERMALLY CONDUCTIVE SHEET AND METHOD FOR MANUFACTURING THERMALLY CONDUCTIVE SHEET

TECHNICAL FIELD

The present technology relates to a thermally conductive sheet and a method for manufacturing a thermally conductive sheet. This application claims priority based on Japanese Application No. 2020-86074 filed on May 15, 2020, in Japan and Japanese Application No. 2020-149489 filed on Sep. 4, 2020, in Japan, which are incorporated herein by reference.

BACKGROUND ART

With the enhancement of the performance of electronic appliances, the density and integration of semiconductor devices are increasing. Accordingly, it is important to more efficiently dissipate heat generated by electronic components constituting the electronic appliances. For example, in a semiconductor device, an electronic component is attached to a heat sink such as a heat radiation fan or a heat radiation plate through a thermally conductive sheet in order to efficiently dissipate heat. As a thermally conductive sheet, for example, there is widely used a silicone resin in which a filler such as an inorganic filler is contained (dispersed). Further improvement in thermal conductivity is required for a heat radiating member such as this thermally conductive sheet. For example, in order to increase the thermal conductivity of a thermally conductive sheet, it has been considered to increase the filling ratio of the inorganic filler blended in a matrix such as a binder resin. However, increasing the filling ratio of the inorganic filler will impair the flexibility of the thermally conductive sheet and cause powder fall, so that there is a limit in increasing the filling ratio of the inorganic filler.

Examples of the inorganic filler include alumina, aluminum nitride, and aluminum hydroxide. Further, in order to increase the thermal conductivity, scaly particles such as boron nitride and graphite, and carbon fibers may be filled in the matrix. This is due to the anisotropy of the thermal conductivity of the scaly particles or the like. For example, carbon fibers are known to have a thermal conductivity of about 600 to 1,200 W/m*K in the fiber direction. In addition, boron nitride is known to have a thermal conductivity of about 110 W/m*K in the surface direction and a thermal conductivity of about 2 W/m*K in the direction perpendicular to the surface direction. Thus, the thermal conductivity is expected to be remarkably improved by making the fiber direction of the carbon fiber and the surface direction of the scaly particles the same as the thickness direction of the sheet, which is the heat transfer direction, in other words, by orienting the carbon fiber and the scaly particles in the thickness direction of the sheet.

In recent years, from the viewpoint of electromagnetic wave control in a communication device such as a cellular phone, there has been a demand for a heat radiation material in which the relative permittivity as well as the thermal conductivity is controlled.

CITATION LIST

Patent Literature

Patent Document 1: Japanese Unexamined Patent Application Publication No. 06-38460

SUMMARY OF INVENTION

Technical Problem

The present technology is proposed in view of such conventional circumstances, and provides a thermally conductive sheet in which relative permittivity and thermal conductivity in the thickness direction and relative permittivity and thermal conductivity in the surface direction are different, and a method for manufacturing the thermally conductive sheet.

Solution to Problem

A thermally conductive sheet according to the present technology includes a binder resin; a first thermally conductive filler comprising a scaly thermally conductive filler and/or a fibrous thermally conductive filler; and a second thermally conductive filler comprising a non-scaly and non-fibrous thermally conductive filler, the first thermally conductive filler and the second thermally conductive filler being dispersed in the binder resin, wherein relative permittivity and thermal conductivity in the thickness direction of the thermally conductive sheet and relative permittivity and thermal conductivity in the surface direction of the thermally conductive sheet are different.

A method for manufacturing a thermally conductive sheet according to the present invention includes: step A of preparing a resin composition for forming a thermally conductive sheet by dispersing a first thermally conductive filler comprising a scaly thermally conductive filler and/or a fibrous thermally conductive filler and a second thermally conductive filler comprising a non-scaly and non-fibrous thermally conductive filler in a binder resin; step B of forming a molded block from the resin composition for forming a thermally conductive sheet; and a step C of slicing the molded block into a sheet shape to obtain a thermally conductive sheet in which relative permittivity and thermal conductivity in the thickness direction of the thermally conductive sheet and relative permittivity and thermal conductivity in the surface direction of the thermally conductive sheet are different.

Advantageous Effects of Invention

According to the present technology, it is possible to provide a thermally conductive sheet in which relative permittivity and thermal conductivity in the thickness direction and relative permittivity and thermal conductivity in the surface direction are different.

DESCRIPTION OF EMBODIMENTS

In the present specification, the average particle size (D50) of the thermally conductive filler is the diameter value in microns where half of the population of the particles of the thermally conductive filler resides below this point, in other words, the diameter at which, in the cumulative curve obtained with the total area of the population of the thermally conductive filler being 100%, the cumulative value is 50% from the small particle size side of the particle size distribution of the thermally conductive filler. In the case where the thermally conductive filler is a fibrous thermally conductive filler, D50 means the fiber length in microns where half of the population of the fibers of the fibrous thermally conductive filler resides below this point, in other words, the fiber length at which, in the cumulative curve obtained with the total area of the population of the fibrous thermally conductive filler being 100%, the cumulative value is 50%. The particle size distribution (particle diameter distribution) in this specification is obtained by volume basis. Examples of the method for measuring the particle size distribution include a method that uses a laser diffraction type particle size distribution measuring device.

Thermally Conductive Sheet

Figure 1:
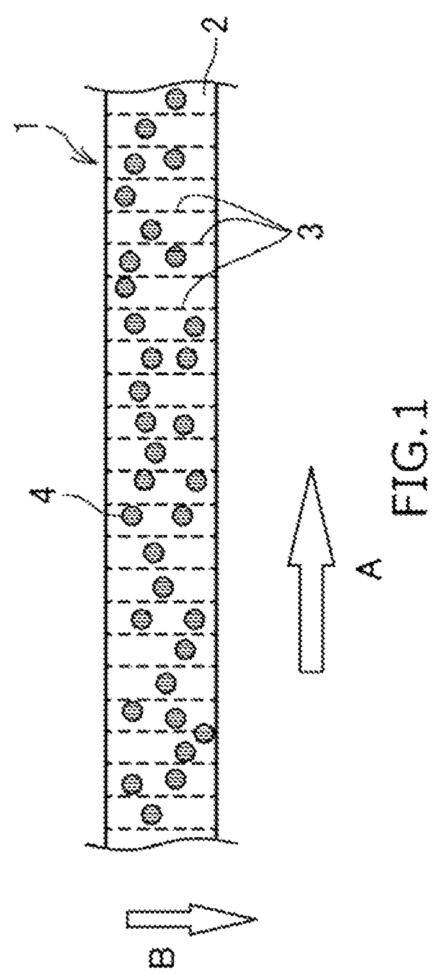
FIG. 1 is a cross-sectional view illustrating an example of a thermally conductive sheet according to the present technology.

FIG. 1 is a cross-sectional view illustrating an example of a thermally conductive sheet 1 according to the present technology. The thermally conductive sheet 1 contains a binder resin 2, a first thermally conductive filler 3 comprising a scaly thermally conductive filler and/or a fibrous thermally conductive filler, and a second thermally conductive filler 4 comprising a non-scaly and non-fibrous thermally conductive filler, wherein the first thermally conductive filler 3 and the second thermally conductive filler 4 are dispersed in the binder resin 2. Further, relative permittivity and thermal conductivity in the thickness direction B of the thermally conductive sheet 1 and relative permittivity and thermal conductivity in the surface direction A of the thermally conductive sheet 1 are different; in other words, the thermally conductive sheet 1 has anisotropic relative permittivity and thermal conductivity in the thickness direction B and the surface direction A. As described above, since the relative permittivity is controlled together with the thermal conductivity, the thermally conductive sheet 1 can be expected to have new applications, for example, in the field of shielding and antennas. The components of the thermally conductive sheet 1 will be described below.

Binder Resin

The binder resin 2 is used for holding the first thermally conductive filler 3 and the second thermally conductive filler 4 in the thermally conductive sheet 1. The binder resin 2 is selected according to characteristics such as mechanical strength, heat resistance, and electrical properties required for the thermally conductive sheet 1. The binder resin 2 may be selected from a thermoplastic resin, a thermoplastic elastomer, and a thermosetting resin.

Examples of the thermoplastic resin include polyethylene, polypropylene, ethylene-αolefin copolymer such as ethylene-propylene copolymer, polymethylpentene, polyvinyl chloride, polyvinylidene chloride, polyvinyl acetate, ethylene-vinyl acetate copolymer, polyvinyl alcohol, polyvinyl acetal, fluoropolymers such as polyvinylidene fluoride and polytetrafluoroethylene, polyethylene terephthalate, polybutylene terephthalate, polyethylene naphthalate, polystyrene, polyacrylonitrile, styrene-acrylonitrile copolymer, acrylonitrile-butadiene-styrene copolymer (ABS) resin, polyphenylene ether copolymer (PPE) resin, modified PPE resin, aliphatic polyamides, aromatic polyamides, polyimide, polyamideimide, polymethacrylic acid, polymethacrylate esters such as polymethacrylic acid methyl ester, polyacrylic acids, polycarbonate, polyphenylene sulfide, polysulfone, polyether sulfone, polyether nitrile, polyether ketone, polyketone, liquid crystal polymer, silicone resin, and ionomer.

Examples of the thermoplastic elastomer include a styrene-butadiene block copolymer or a hydrogenated product thereof, a styrene-isoprene block copolymer or a hydrogenated product thereof, a styrene-based thermoplastic elastomer, an olefin-based thermoplastic elastomer, a vinyl chloride-based thermoplastic elastomer, a polyester-based thermoplastic elastomer, a polyurethane-based thermoplastic elastomer, and a polyamide-based thermoplastic elastomer.

Examples of the thermosetting resin include crosslinked rubber, epoxy resin, phenol resin, polyimide resin, unsaturated polyester resin, and diallyl phthalate. Examples of the crosslinked rubber include natural rubber, acrylic rubber, butadiene rubber, isoprene rubber, styrene-butadiene copolymer rubber, nitrile rubber, hydrogenated nitrile rubber, chloroprene rubber, ethylene-propylene copolymer rubber, chlorinated polyethylene rubber, chlorosulfonated polyethylene rubber, butyl rubber, halogenated butyl rubber, fluororubber, urethane rubber, and silicone rubber.

As the binder resin 2, for example, silicone resin is preferable in view of adhesion between the heat-generating surface of the electronic component and the heat sink surface. Examples of the silicone resin may include a two-part addition reaction type silicone resin comprising a silicone having an alkenyl group as a main component, a main agent containing a curing catalyst, and a curing agent having a hydrosilyl group (Si—H group). Examples of the silicone having an alkenyl group may include a polyorganosiloxane having a vinyl group. The curing catalyst is a catalyst for promoting an addition reaction between an alkenyl group in the silicone having the alkenyl group and a hydrosilyl group in the curing agent having the hydrosilyl group. Examples of the curing catalyst include catalysts known as catalysts used in hydrosilylation reaction, for example, a platinum group-based curing catalyst such as a platinum group metal single substance such as platinum, rhodium, and palladium, or platinum chloride. Examples of the curing agent having the hydrosilyl group include a polyorganosiloxane having a hydrosilyl group. The binder resin 2 may be used alone or in combination of two or more.

The content of the binder resin 2 in the thermally conductive sheet 1 is not particularly limited and may be appropriately selected according to the purpose. For example, the lower limit of the content of the binder resin 2 in the thermally conductive sheet 1 may be 20% by volume or more, 25% by volume or more, or 30% by volume or more. The upper limit of the content of the binder resin 2 in the thermally conductive sheet 1 may be 70% by volume or less, 60% by volume or less, or 50% by volume or less. From the viewpoint of flexibility of the thermally conductive sheet 1, the content of the binder resin 2 in the thermally conductive sheet 1 is preferably 25 to 60% by volume.

First Thermally Conductive Filler

The first thermally conductive filler 3 may be a scaly thermally conductive filler, a fibrous thermally conductive filler, or a combination of the scaly thermally conductive filler and the fibrous thermally conductive filler.

The scaly thermally conductive filler has a high aspect ratio and an isotropic thermal conductivity in the surface direction. The scaly thermally conductive filler is not particularly limited as long as it is scaly, and may include boron nitride (BN), mica, alumina, aluminum nitride, silicon carbide, silica, zinc oxide, and molybdenum disulfide, among others.

The fibrous thermally conductive filler is not particularly limited as long as it is fibrous and has necessary thermal conductivity, and aluminum nitride fiber, ultrahigh molecular weight polyethylene fiber, and polyparaphenylene bisoxazole fiber, among others are preferable from the viewpoint of high thermal conductivity and insulating property. Further, as long as the relative permittivity of the thermally conductive sheet 1 is not impaired, the fibrous thermally conductive filler may be conductive, such as carbon fibers or fibers made of a metal (such as copper, stainless steel, or nickel).

Figure 2:
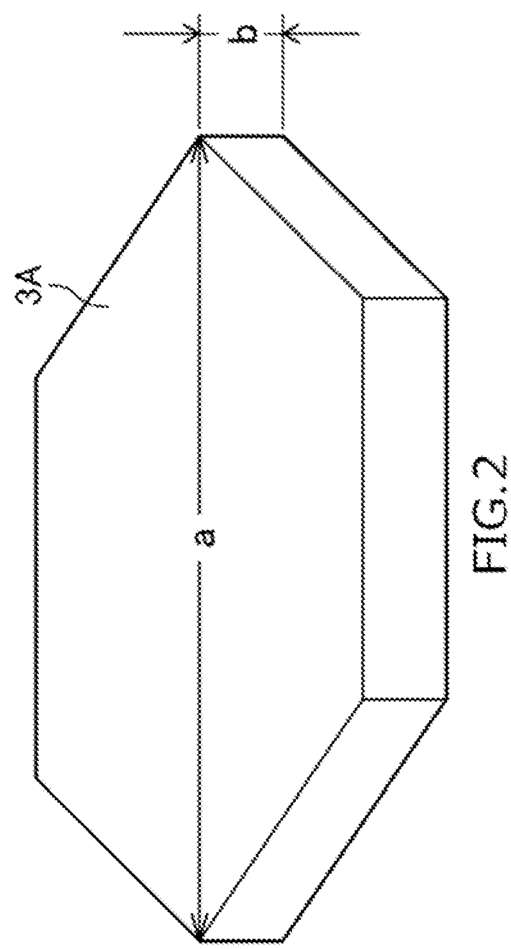
FIG. 2 is a perspective view schematically illustrating a scaly boron nitride having a hexagonal crystal shape.

FIG. 2 is a perspective view schematically illustrating a scaly boron nitride 3A having a hexagonal crystal shape. As the scaly thermally conductive filler, the scaly boron nitride 3A having a hexagonal crystal shape as shown in FIG. 2 is preferably used from the viewpoints of the relative permittivity and the thermal conductivity of the thermally conductive sheet 1. The scaly thermally conductive filler may be used alone or in combination of two or more. The thermally conductive sheet 1 according to the present technology can exhibit excellent thermal and dielectric properties by using a scaly thermally conductive filler (e.g., the scaly boron nitride 3A) which is less expensive than a spherical thermally conductive filler (such as spherical boron nitride) as the first thermally conductive filler 3.

The average particle size (D50) of the scaly thermally conductive filler is not particularly limited and may be appropriately selected according to the purpose. For example, the lower limit of the average particle size of the scaly thermally conductive filler may be 10 μm or more, 20 μm or more, 30 μm or more, or 35 μm or more. The upper limit of the average particle size of the scaly thermally conductive filler may be 150 μm or less, 100 μm or less, 90 μm or less, 80 μm or less, 70 μm or less, 50 μm or less, and 45 μm or less. From the viewpoint of the thermal conductivity of the thermally conductive sheet 1, the average particle size of the scaly thermally conductive filler is preferably 20 to 100 μm. The D50 of the fibrous thermally conductive filler is not particularly limited and may be appropriately selected according to the purpose, for example, 20 to 250 μm.

The aspect ratio (average major diameter/average minor diameter) of the first thermally conductive filler 3 is not particularly limited and may be appropriately selected according to the purpose. For example, the aspect ratio of the scaly thermally conductive filler may be in the range of 10 to 100. The average major diameter and average minor diameter of the first thermally conductive filler 3 can be measured by, for example, a microscope, a scanning electron microscope (SEM), or a particle size distribution meter. As an example, when the scaly boron nitride 3A having a hexagonal crystal shape as shown in FIG. 2 is used as the scaly thermally conductive filler, the average value may be calculated by arbitrarily selecting 200 or more boron nitrides 3A from an image captured by a SEM, and determining the respective ratios of the major diameter a to the minor diameter b (a/b).

The content of the first thermally conductive filler 3 in the thermally conductive sheet 1 is not particularly limited and may be appropriately selected according to the purpose. For example, the lower limit of the content of the first thermally conductive filler 3 in the thermally conductive sheet 1 may be 15% by volume or more, 20% by volume or more, or 25% by volume or more. The upper limit of the content of the first thermally conductive filler 3 in the thermally conductive sheet 1 may be 45% by volume or less, 40% by volume or less, 35% by volume or less, or 30% by volume or less. From the viewpoint of the thermal conductivity and flexibility of the thermally conductive sheet 1, the content of the first thermally conductive filler 3 in the thermally conductive sheet 1 is preferably 20 to 35% by volume. From the viewpoint of the anisotropy of the permittivity of the thermally conductive sheet 1, the content of the first thermally conductive filler 3 in the thermally conductive sheet 1 is preferably 20% by volume or more and less than 40% by volume, and more preferably 20 to 27% by volume.

Second Thermally Conductive Filler

The second thermally conductive filler 4 is a thermally conductive filler other than the first thermally conductive filler 3 described above. The second thermally conductive filler 4 is non-scaly and non-fibrous, and includes, for example, a spherical, powdery, granular, or flat thermally conductive filler. The material of the second thermally conductive filler 4 is preferably a material capable of ensuring the insulating property of the thermally conductive sheet 1 in consideration of the effects of the present technology, and may include aluminum oxide (alumina, sapphire), aluminum nitride, boron nitride, zirconia, and silicon carbide, among others. The second thermally conductive filler 4 may be used alone or in combination of two or more.

In particular, as the second thermally conductive filler 4, aluminum nitride particles and spherical alumina particles are preferably used in combination from the viewpoint of the relative permittivity and thermal conductivity of the thermally conductive sheet 1. From the viewpoint of viscosity reduction of the thermally conductive sheet 1 before thermosetting, the average particle size of the aluminum nitride particles is preferably 1 to 5 μm, may be 1 to 3 μm, and may be 1 to 2 μm. Further, from the viewpoint of viscosity reduction of the thermally conductive sheet 1 before thermosetting, the average particle size of the spherical alumina particles is preferably 1 to 3 μm, and may be 1.5 to 2.5 μm.

The content of the second thermally conductive filler 4 in the thermally conductive sheet 1 is not particularly limited and may be appropriately selected according to the purpose. The lower limit of the content of the second thermally conductive filler 4 in the thermally conductive sheet 1 may be 10% by volume or more, 15% by volume or more, or 20% by volume or more. The upper limit of the content of the second thermally conductive filler 4 in the thermally conductive sheet 1 may be 50% by volume or less, 40% by volume or less, 30% by volume or less, or 25% by volume or less. The total content of the second thermally conductive filler 4 in the thermally conductive sheet 1 may be, for example, 30 to 60% by volume.

When spherical alumina particles are used alone as the second thermally conductive filler 4, the content of the spherical alumina particles in the thermally conductive sheet 1 is preferably 10 to 45% by volume from the viewpoint of viscosity reduction of the thermally conductive sheet 1 before thermosetting. When aluminum nitride particles and spherical alumina particles are used in combination as the second thermally conductive filler 4 as described above, the content of the spherical alumina particles is preferably 10 to 25% by volume, and the content of the aluminum nitride particles is preferably 10 to 25% by volume in the thermally conductive sheet 1 from the viewpoint of viscosity reduction of the thermally conductive sheet 1 before thermosetting.

The thermally conductive sheet 1 may further contain components other than those described above to the extent that the effects of the present technology are not impaired. The other components may include a dispersant, a curing accelerator, a retarder, a tackifier, a plasticizer, a flame retardant, an antioxidant, a stabilizer, and a colorant, As described above, in the thermally conductive sheet 1 in which the first thermally conductive filler 3 and the second thermally conductive filler 4 are dispersed in the binder resin 2, relative permittivity and thermal conductivity in the thickness direction B shown in FIG. 1 of the thermally conductive sheet and relative permittivity and thermal conductivity in the surface direction A shown in FIG. 1 of the thermally conductive sheet are different. In particular, by using the first thermally conductive filler 3 and the second thermally conductive filler 4 in combination, the second thermally conductive filler 4 can support the orientation of the first thermally conductive filler 3, so that the first thermally conductive filler 3 can be oriented in the thickness direction B of the thermally conductive sheet 1 as well as possible.

In the thermally conductive sheet 1, it is preferable that the first thermally conductive filler 3 is oriented in the thickness direction B of the thermally conductive sheet 1, the thermal conductivity in the thickness direction B is larger than the thermal conductivity in the surface direction A, and the relative permittivity in the thickness direction B is larger than the relative permittivity in the surface direction A. For example, in the thermally conductive sheet 1, the thermal conductivity in the orientation direction (for example, the thickness direction B of the thermally conductive sheet 1) of the first thermally conductive filler 3 may be twice or more the thermal conductivity in the non-orientation direction (for example, the surface direction A of the thermally conductive sheet 1) of the first thermally conductive filler 3. The thermal conductivity of the thermally conductive sheet 1 in the thickness direction B may be, for example, 1 W/m*K or more, 4 W/m*K or more, 7 W/m*K or more, or 9 W/m*K or more. The thermal conductivity of the thermally conductive sheet 1 in the surface direction A may be, for example, 1 W/m*K or more, 3 W/m*K or more, or 3.5 W/m*K or more.

The relative permittivity (30 GHz) of the thermally conductive sheet 1 in the thickness direction B may be, for example, 4.0 or more, 5.0 or more, 30 or more, or 60 or more. The relative permittivity (30 GHz) of the thermally conductive sheet 1 in the surface direction A may be, for example, 3.0 or more, 4.0 or more, 4.5 or more, 10 or more, or 20 or more. The thermal conductivity and relative permittivity of the thermally conductive sheet can be measured by the method described in the examples described below.

The average thickness of the thermally conductive sheet 1 is not particularly limited and may be appropriately selected according to the purpose. For example, the lower limit of the average thickness of the thermally conductive sheet may be 0.05 mm or more, or 0.1 mm or more. The upper limit of the average thickness of the thermally conductive sheet may be 5 mm or less, 4 mm or less, or 3 mm or less. From the viewpoint of the handleability of the thermally conductive sheet 1, the average thickness of the thermally conductive sheet 1 is preferably 0.1 to 4 mm. The average thickness of the thermally conductive sheet 1 can be obtained, for example, from the arithmetic average value of the thickness of the thermally conductive sheet measured at arbitrary five points.

Method for Manufacturing Thermally Conductive Sheet

A method for manufacturing a thermally conductive sheet according to the present technology includes the following steps A, B, and C.

Step A

In step A, a resin composition for forming a thermally conductive sheet is prepared by dispersing a first thermally conductive filler 3 and a second thermally conductive filler 4 in a binder resin 2. The resin composition for forming a thermally conductive sheet can be prepared by uniformly mixing the first thermally conductive filler 3, the second thermally conductive filler 4, and the binder resin 2, as well as various additives and volatile solvents as necessary by a known method.

Step B

In step B, a molded block is formed from the prepared resin composition for forming a thermally conductive sheet. Examples of the method of forming the molded block include an extrusion molding method and an in-mold molding method. The extrusion molding method and the in-mold molding method are not particularly limited and may be suitably employed among various known extrusion molding methods and in-mold molding methods depending on the viscosity of the resin composition for forming a thermally conductive sheet and characteristics required for the thermally conductive sheet.

For example, when a resin composition for forming a thermally conductive sheet is extruded from a die in an extrusion molding method, or when a resin composition for forming a thermally conductive sheet is press-fitted into a mold for an in-mold molding method, the binder resin flows and the first thermally conductive filler 3 is oriented along the flow direction.

In step B, uncured sheets (green sheets) may be prepared from the resin composition for forming a thermally conductive sheet by using a bar coater, and the green sheets may be laminated to form a molded block. For example, in this method, the green sheets are obtained by making a 50 to 500 μm thick sheet by using a bar coater and drying the sheet in an oven at 80 to 120° C. for 5 to 20 minutes. Next, uncured green sheets are laminated at a desired height to form a laminate. Then the laminate is further cured to form the molded block.

The size and shape of the molded block can be determined in accordance with the size of the thermally conductive sheet 1. For example, this may be a cuboid having a cross section of 0.5 to 15 cm in length and 0.5 to 15 cm in width. The length of the cuboid may be determined as necessary.

Step C

In step C, the molded block is sliced into a sheet shape to obtain thermally conductive sheet in which relative permittivity and thermal conductivity in the thickness direction of the thermally conductive sheet and relative permittivity and thermal conductivity in the surface direction of the thermally conductive sheet are different. The first thermally conductive filler 3 is exposed on the surface (slice surface) of the sheet obtained by the slice. The slicing method is not particularly limited and may be suitably selected from known slicing devices (preferably ultrasonic cutters) according to the size and mechanical strength of the molded block. When the molding method is an extrusion molding method, since the first thermally conductive filler 3 may be oriented in the extrusion direction, the slice direction of the molded block is preferably 60 to 120 degrees relative to the extrusion direction, more preferably 70 to 100 degrees, and even more preferably 90 degrees (perpendicular). The slice direction of the molded block is not particularly limited and may be appropriately selected according to the purpose of use of the thermally conductive sheet 1.

As described above, the manufacturing method of the thermally conductive sheet having step A, step B, and step C can produce the thermally conductive sheet 1 containing the binder resin 2, the first thermally conductive filler 3, and the second thermally conductive filler 4, in which the first thermally conductive filler 3 and the second thermally conductive filler 4 are dispersed in the binder resin 2, and relative permittivity and thermal conductivity in the thickness direction B and relative permittivity and thermal conductivity in the surface direction A are different.

The method for manufacturing the thermally conductive sheet according to the present technology is not limited to the above-described example, and may further include, for example, step D of pressing the slice surface after step C. By including the pressing step D in the manufacturing method of the thermally conductive sheet, the surface of the sheet obtained in step C is smoothed more, and the adhesion with other members can be further improved. As a pressing method, a device comprising a pair of a pressing flat plate and a flat press head can be used. Further, the sheet may be pressed by a pinch roll. The pressure of pressing may be, for example, 0.1 to 100 MPa. In order to further improve the effect of pressing and to reduce the pressing time, the pressing is preferably carried out at or above the glass transition temperature (Tg) of the binder resin 2. For example, the press temperature may be 0 to 180° C., within a temperature range from room temperature (e.g., 25° C.) to 100° C., or 30 to 100° C.

Electronic Device

The thermally conductive sheet according to the present technology can be, for example, disposed between a heat-generating element and a heat-dissipating element, thereby forming an electronic device (thermal device) having a structure in which the thermally conductive sheet is disposed between the heat-generating element and the heat-dissipating element for releasing heat generated by the heat-generating element to the heat-dissipating element. The electronic device includes at least the heat-generating element, the heat-dissipating element, and the thermally conductive sheet, and may further include other components if necessary.

The heat-generating element is not particularly limited, and includes, for example, an integrated circuit element such as a CPU (Central Processing Unit), a GPU (Graphics Processing Unit), a DRAM (Dynamic Random Access Memory), and a flash memory, and electronic components which generate heat in an electric circuit such as a transistor and a resistor. The heat-generating element also includes a component for receiving an optical signal such as an optical transceiver in a communication device.

The heat-dissipating element is not particularly limited and may include components such as a heat sink or a heat spreader used in combination with an integrated circuit element, a transistor, or an optical transceiver housing, among others. In addition to the heat spreader and the heat sink, the heat-dissipating element may be any components that conduct heat generated in a heat source to dissipate the heat to the outside, such as a heat radiator, a cooler, a die pad, a printed circuit board, a cooling fan, a Peltier element, a heat pipe, a metal cover, and a housing.

Figure 3:
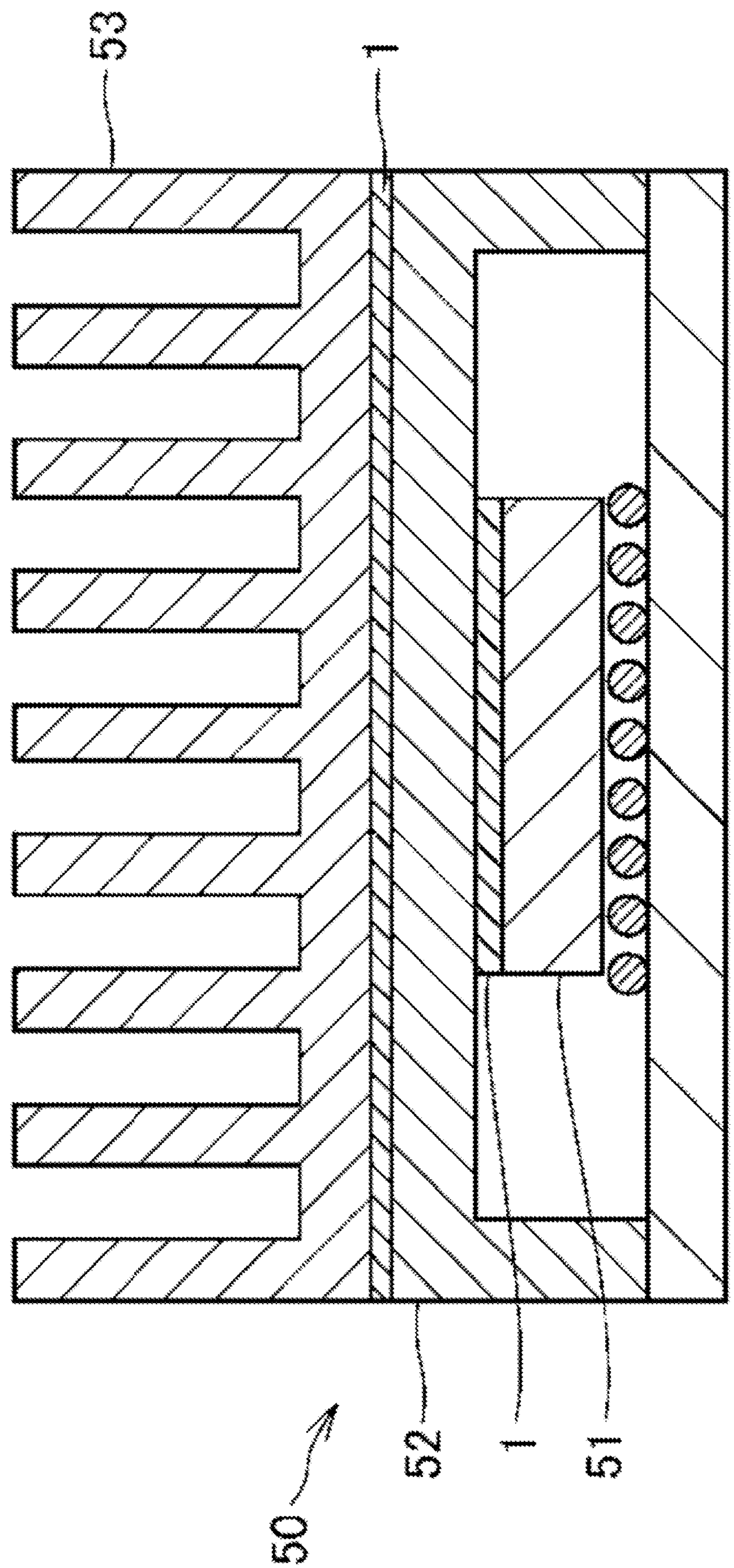
FIG. 3 is a cross-sectional view illustrating an example of a semiconductor device to which a thermally conductive sheet according to the present technology is applied.

FIG. 3 is a cross-sectional view illustrating an example of a semiconductor device 50 to which the thermally conductive sheet 1 according to the present technology is applied. For example, as shown in FIG. 3, the thermally conductive sheet 1 is mounted on a semiconductor device 50 incorporated in various electronic devices, and sandwiched between a heat-generating element and a heat-dissipating element. The semiconductor device 50 shown in FIG. 3 includes an electronic component 51, a heat spreader 52, and a thermally conductive sheet 1, and the thermally conductive sheet 1 is held between the heat spreader 52 and the electronic component 51. The thermally conductive sheet 1 sandwiched between the heat spreader 52 and the heat sink 53 can constitute a heat-dissipating member for dissipating heat of the electronic component 51 together with the heat spreader 52. The mounting place of the thermally conductive sheet 1 is not limited to between the heat spreader 52 and the electronic component 51, or between the heat spreader 52 and the heat sink 53, and may be appropriately selected according to the constitution of the electronic device or the semiconductor device.

EXAMPLES

Examples of the present technology will be described below. In the examples, thermally conductive sheets were prepared, and each of the relative permittivity and thermal conductivity in the thickness direction and the surface direction of the thermally conductive sheet were measured. The present technology is not limited to these examples.

Example 1

A resin composition for forming a thermally conductive sheet is prepared by uniformly mixing 33% by volume of silicone resin, 27% by volume of scaly boron nitride (D50: 40 μm) having a hexagonal crystal shape, 20% by volume of aluminum nitride (D50: 1.2 μm), and 20% by volume of spherical alumina particles (D50: 2 μm). The resin composition for forming a thermally conductive sheet was poured into a mold (opening: 50 mm×50 mm) having a cuboid internal space by an extrusion molding method and heated in an oven at 60° C. for 4 hours to form a molded block. The inner surface of the mold was release-treated by attaching a releasable polyethylene terephthalate film. The molded block thus obtained was sliced into a sheet having a thickness of 1 mm by an ultrasonic cutter in a direction perpendicular to the length direction of the obtained molded block, thereby obtaining a thermally conductive sheet in which scaly boron nitride was oriented in the thickness direction of the sheet.

Example 2

A thermally conductive sheet was obtained by the same method as in Example 1 except that a resin composition for forming a thermally conductive sheet was prepared by uniformly mixing 37% by volume of silicone resin, 23% by volume of scaly boron nitride (D50: 40 μm) having a hexagonal crystal shape, 20% by volume of aluminum nitride (D50: 1.2 μm), and 20% by volume of spherical alumina particles (D50: 2 μm).

Example 3

A thermally conductive sheet was obtained by the same method as in Example 1 except that a resin composition for forming a thermally conductive sheet was prepared by uniformly mixing 60% by volume of silicone resin, 20% by volume of scaly boron nitride (D50: 40 μm) having a hexagonal crystal shape, 10% by volume of aluminum nitride (D50: 1.2 μm), and 10% by volume of spherical alumina particles (D50: 2 μm).

Example 4

A thermally conductive sheet having carbon fibers oriented in the thickness direction of the sheet was obtained by the same method as in Example 1, except that a resin composition for forming a thermally conductive sheet was prepared by uniformly mixing 35% by volume of silicone resin, 23% by volume of carbon fibers (D50: 150 μm), and 42% by volume of spherical alumina particles (D50: 3 μm), and that a molded block was formed by heating the composition in an oven at 100° C. for 6 hours.

Example 5

A resin composition for forming a thermally conductive sheet is prepared by uniformly mixing 33% by volume of silicone resin, 27% by volume of scaly boron nitride (D50: 40 μm) having a hexagonal crystal shape, 20% by volume of aluminum nitride (D50: 1.2 μm), and 20% by volume of spherical alumina particles (D50: 2 μm). A sheet having a thickness of 1 mm was prepared by using a bar coater and cured in an oven at 60° C. for 30 minutes to obtain uncured green sheets, and the sheets were laminated to form a laminate of 50 mm×50 mm and heated in an oven at 60° C. for 4 hours to form a molded block. The molded block thus obtained was sliced into a sheet having a thickness of 1 mm by using an ultrasonic cutter to obtain a thermally conductive sheet in which scaly boron nitride was oriented in the thickness direction of the sheet.

Example 6

A resin composition for forming a thermally conductive sheet is formed by uniformly mixing 33% by volume of silicone resin, 27% by volume of scaly boron nitride (D50: 40 μm) having a hexagonal crystal shape, 20% by volume of aluminum nitride (D50: 1.2 μm), and 20% by volume of spherical alumina particles (D50: 2 μm). A laminate of 50 mm×50 mm was prepared by using a die head (opening: height 1 mm×slit width 0.5 mm) and heated in an oven at 60° C. for 4 hours to form a molded block. The molded block thus obtained was sliced into a 1 mm thick sheet by an ultrasonic cutter to obtain a thermally conductive sheet in which scaly boron nitride was oriented in the thickness direction of the sheet.

Comparative Example 1

A thermally conductive sheet was obtained by the same method as in Example 1, except that a resin composition for forming a thermally conductive sheet was prepared by uniformly mixing 60% by volume of silicone resin, 20% by volume of spherical boron nitride (D50: 25 μm), 10% by volume of aluminum nitride (D50: 1.2 μm), and 10% by volume of spherical alumina particles (D50: 2 μm).

Comparative Example 2

A thermally conductive sheet was obtained by the same method as in Example 1, except that a resin composition for forming a thermally conductive sheet was prepared by uniformly mixing 60% by volume of silicone resin, 20% by volume of spherical boron nitride (D50: 50 μm), 10% by volume of aluminum nitride (D50: 1.2 μm), and 10% by volume of spherical alumina particles (D50: 2 μm).

Comparative Example 3

A thermally conductive sheet was obtained by the same method as in Example 1, except that a resin composition for forming a thermally conductive sheet was prepared by uniformly mixing 60% by volume of silicone resin and 40% by volume of scaly boron nitride (D50: 40 μm) having a hexagonal crystal shape.

Thermal Conductivity

The effective thermal conductivities (W/m*K) in the thickness direction and in the surface direction of the thermally conductive sheet were measured at a load of 1 kgf/cm$^2$ by using a thermal resistance measuring device conforming to ASTM-D 5470. The results are shown in Table 1. In Table 1, "thickness direction" and "surface direction" represent the measurement direction of the effective thermal conductivity in the thermally conductive sheet. Further, the direction in which carbon fibers and scaly boron nitride are oriented in the sheet is the "thickness direction" and the direction perpendicular to the thickness direction is the "surface direction".

Permittivity

The relative permittivities (30 GHz) in the thickness direction and the surface direction of the thermally conductive sheet were measured. The results are shown in Table 1.

TABLE 1

| | | Ex. 1 | Ex. 2 | Ex. 3 | Ex. 4 | Ex. 5 |
|---|---|---|---|---|---|---|
| binder resin | silicone resin volume filling rate (vol %) | 33 | 37 | 60 | 35 | 33 |
| first thermally conductive filler | scaly boron nitride (D50 = 40 μm) volume filling rate (vol %) | 27 | 23 | 20 | — | 27 |
| | carbon fiber (D50 = 150 μm) volume filling rate (vol %) | — | — | — | 23 | — |
| second thermally conductive filler | spherical boron nitride (D50 = 25 μm) volume filling rate (vol %) | — | — | — | — | — |
| | spherical boron nitride (D50 = 50 μm) volume filling rate (vol %) | — | — | — | — | — |
| | aluminum nitride (D50 = 1.2 μm) volume filling rate (vol %) | 20 | 20 | 10 | — | 20 |

TABLE 1-continued

| | | | | | | | | | | | |
|---|---|---|---|---|---|---|---|---|---|---|---|
| | spherical alumina C11 (D50 = 3 μm) volume filling rate (vol %) | — | | — | | — | | 42 | | — | |
| | spherical alumina (D50 = 2 μm) volume filling rate (vol %) | 20 | | 20 | | 10 | | — | | 20 | |
| evaluation of thermally conductive sheet | orientation | thickness direction | surface direction | thickness direction | surface direction | thickness direction | surface direction | thickness direction | surface direction | thickness direction | surface direction |
| | effective thermal conductivity (W/m*K) | 9 | 3.5 | 7.5 | 3 | 5 | 1 | 18 | 3.5 | 8.9 | 3.6 |
| | relative permittivity (30 GHz) | 5.6 | 4.8 | 5.3 | 4.4 | 4.2 | 3.6 | 90 | 30 | 5.5 | 4.8 |

| | | Ex. 6 | | Comp. 1 | | Comp. 2 | | Comp. 3 | |
|---|---|---|---|---|---|---|---|---|---|
| binder resin | silicone resin volume filling rate (vol %) | 33 | | 60 | | 60 | | 60 | |
| first thermally conductive filler | scaly boron nitride (D50 = 40 μm) volume filling rate (vol %) | 27 | | — | | — | | 40 | |
| | carbon fiber (D50 = 150 μm) volume filling rate (vol %) | — | | — | | — | | — | |
| second thermally conductive filler | spherical boron nitride (D50 = 25 μm) volume filling rate (vol %) | — | | 20 | | — | | — | |
| | spherical boron nitride (D50 = 50 μm) volume filling rate (vol %) | — | | — | | 20 | | — | |
| | aluminum nitride (D50 = 1.2 μm) volume filling rate (vol %) | 20 | | 10 | | 10 | | — | |
| | spherical alumina C11 (D50 = 3 μm) volume filling rate (vol %) | — | | — | | — | | — | |
| | spherical alumina (D50 = 2 μm) volume filling rate (vol %) | 20 | | 10 | | 10 | | — | |
| evaluation of thermally conductive sheet | orientation | thickness direction | surface direction | thickness direction | surface direction | thickness direction | surface direction | thickness direction | surface direction |
| | effective thermal conductivity (W/m*K) | 8.8 | 3.6 | 3 | 3 | 2 | 2 | 6 | 3 |
| | relative permittivity (30 GHz) | 5.6 | 4.7 | 4.1 | 4.1 | 3.9 | 3.9 | 3.7 | 3.7 |

It was found that Examples 1 to 6 could produce a thermally conductive sheet containing a binder resin, a first thermally conductive filler, and a second thermally conductive filler, in which the first scaly thermally conductive filler and the second thermally conductive filler are dispersed in the binder resin, and relative permittivity and thermal conductivity in the thickness direction and relative permittivity and thermal conductivity in the surface direction are different. In other words, the thermally conductive sheets obtained in Examples 1 to 6 were found to have an anisotropy of the relative permittivity and the thermal conductivity in the thickness direction and the surface direction.

It was also found that the thermally conductive sheets obtained in Examples 1 to 6 had a thermal conductivity in the orientation direction (thickness direction) of the first thermally conductive filler of twice or more that in the non-orientation direction (surface direction) of the first thermally conductive filler.

Further, from Comparative Examples 1 and 2, it was found that the resin composition containing no first thermally conductive filler could not form a thermally conductive sheet in which relative permittivity and thermal conductivity in the thickness direction and relative permittivity and thermal conductivity in the surface direction are different. In other words, it was found that the thermally conductive sheets obtained in Comparative Examples 1 and 2 did not have anisotropy of relative permittivity and thermal conductivity in the thickness direction and the surface direction.

Further, from Comparative Example 3, it was found that the resin composition containing no second thermally conductive filler could not form a thermally conductive sheet in which relative permittivity and thermal conductivity in the thickness direction and relative permittivity and thermal conductivity in the surface direction are different. Specifically, it was found that the thermally conductive sheet obtained in Comparative Example 3 did not have an anisotropy of the relative permittivity in the thickness direction and the surface direction.

INDUSTRIAL APPLICABILITY

Since the thermally conductive sheet according to the present technology has different relative permittivity and thermal conductivity in the thickness direction and the surface direction, new applications can be expected, for example, in the field of shield and antenna.

REFERENCE SIGNS LIST

1 thermally conductive sheet, 2 binder resin, 3 first thermally conductive filler, 3A scaly boron nitride, 4 second thermally conductive filler, 50 semiconductor device, 51 electronic component, 52 heat spreader, 53 heat sink

The invention claimed is:

1. A thermally conductive sheet containing: a binder resin; a first thermally conductive filler which is a scaly boron nitride; and a second thermally conductive filler comprising a non-scaly and non-fibrous thermally conductive filler, the first thermally conductive filler and the second thermally conductive filler being dispersed in the binder resin, wherein relative permittivity and thermal conductivity in the thickness direction of the thermally conductive sheet and relative permittivity and thermal conductivity in the surface direction of the thermally conductive sheet are different, wherein the thermally conductive sheet contains no carbon fibers, wherein the binder resin comprises a two-part addition reaction type silicone resin prepared by curing a silicone having an alkenyl group as a main component with a curing agent having a hydrosilyl group, wherein the first thermally conductive filler is oriented in the thickness direction of the thermally conductive sheet, wherein a content of the first thermally conductive filler is 20 to 35% by volume, and wherein the second thermally conductive filler comprises aluminum nitride particles and spherical alumina particles, and at least one of (i) a content of the spherical alumina particles is 10 to 25% by volume and (ii) a content of the aluminum nitride particles is 10 to 25% by volume.

2. The thermally conductive sheet according to claim 1, wherein the first thermally conductive filler has an average particle size of 20 to 100 μm.

3. The thermally conductive sheet according to claim 1, wherein the spherical alumina particles have an average particle size of 1 to 3 μm.

4. The thermally conductive sheet according to claim 1, wherein the content of the spherical alumina particles is 10 to 25% by volume.

5. The thermally conductive sheet according to claim 1 wherein the aluminum nitride particles have an average particle size of 1 to 5 μm.

6. The thermally conductive sheet according to claim 1, wherein the content of the aluminum nitride particles is 10 to 25% by volume.

7. The thermally conductive sheet according to claim 1, wherein a thermal conductivity in an orientation direction of the first thermally conductive filler is twice or more of a thermal conductivity in a non-orientation direction of the first thermally conductive filler.

8. An electronic device comprising:

a heat-generating element;

a heat-dissipating element;

the thermally conductive sheet according to claim 1 and disposed between the heat-generating element and the heat-dissipating element.

9. The thermally conductive sheet according to claim 1, wherein no fibers are present.

* * * * *